(12) United States Patent
Park

(10) Patent No.: US 9,054,175 B2
(45) Date of Patent: Jun. 9, 2015

(54) NONVOLATILE MEMORY DEVICE INCLUDING SELECT GATE AND MEMORY GATE

(71) Applicant: SK hynix Inc., Gyeonggi-do (KR)

(72) Inventor: Sung-Kun Park, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/954,499

(22) Filed: Jul. 30, 2013

(65) Prior Publication Data

US 2014/0299930 A1 Oct. 9, 2014

(30) Foreign Application Priority Data

Apr. 8, 2013 (KR) .................. 10-2013-0038041

(51) Int. Cl.
*H01L 29/76* (2006.01)
*H01L 29/78* (2006.01)

(52) U.S. Cl.
CPC ..................... *H01L 29/78* (2013.01)

(58) Field of Classification Search
CPC .............. H01L 29/788; H01L 29/7841; H01L 27/10802; H01L 27/11517; H01L 29/42324; H01L 29/42328; H01L 29/66825

USPC ......... 257/314, 315, 316, 317, 319, 321, 324, 257/E29.129, E29.3
See application file for complete search history.

(56) References Cited

U.S. PATENT DOCUMENTS

| 7,573,742 | B2 | 8/2009 | Ajika et al. |
| 7,969,780 | B2 | 6/2011 | Ogura et al. |
| 8,125,012 | B2 | 2/2012 | Mine et al. |
| 2007/0297224 | A1 | 12/2007 | King et al. |
| 2009/0296491 | A1* | 12/2009 | Hong et al. ............ 365/185.29 |

FOREIGN PATENT DOCUMENTS

KR 100936627 1/2010

* cited by examiner

*Primary Examiner* — Hoai V Pham
(74) *Attorney, Agent, or Firm* — IP & T Group LLP

(57) ABSTRACT

A nonvolatile memory device includes a gate structure including a select gate formed over a substrate and a memory gate formed on one sidewall of the select gate and having a P-type channel, a drain region formed in the substrate at one sidewall of the gate structure and overlapping a part of the memory gate, and a source region formed in the substrate at the other sidewall of the gate structure and overlapping a part of the select gate. The memory gates include a grid of rows and columns with bits of 1's and 0's selectively forming a memory in a nonvolatile memory device.

15 Claims, 13 Drawing Sheets

NONVOLATILE MEMORY DEVICE INCLUDING SELECT GATE AND MEMORY GATE

CROSS-REFERENCE TO RELATED APPLICATIONS

The present application claims priority of Korean Patent Application No. 10-2013-0038041, filed on Apr. 8, 2013, which is incorporated herein by reference in its entirety.

BACKGROUND

1. Field

Exemplary embodiments of the present invention relate to a semiconductor device fabrication technology, and more particularly, to a nonvolatile memory device.

2. Description of the Related Art

Digital media devices have recently emerged that conveniently use desired information anytime and anywhere. A variety of digital devices that are gaining acceptance require a storage medium that will keep taken images, recorded music, and various data in storage. Thus, much attention has been paid to a system on chip (SoC) technology in the non-memory semiconductor field according to a high integration tendency, and the world semiconductor companies are competing with each other to improve the SoC technology. The SoC technology refers to a technology for integrating all system techniques into one semiconductor. When the system design technology is not isolated, it will become difficult to develop a non-memory semiconductor portion.

One of main products in the SoC field where complex techniques are integrated is an embedded memory, and much attention is paid to a flash memory among the embedded memories. The flash memory may be divided into a floating gate type and a silicon-oxide-nitride-oxide-silicon (SONOS) control gate type. Recently, research has been rapidly conducted on the SONOS type. For reference, the SONOS-type flash memory is a nonvolatile memory device using a mechanism of trapping and de-trapping electrons or holes in or from a trap site of a material layer (for example, nitride).

FIG. 1 is a cross-sectional view of a conventional nonvolatile memory device.

Referring to FIG. 1, the conventional SONOS-type flash memory device will be described as follows. A memory gate MG in which a memory layer 105 and a gate electrode 106 are stacked is formed over a substrate 101. A spacer 107 is formed on both sidewalls of the memory gate MG. Source and drain regions 108 are formed in the substrate 101 at both sides of the memory gate MG. The memory layer 105 includes a tunnel insulating layer 102, a charge trap layer 103, and a charge blocking layer 104, which are sequentially stacked. The gate electrode 106 serves as a control gate.

However, the conventional nonvolatile memory device, that is, the SONOS-type flash memory device has a concern that an over-erase occurs during an erase operation. In order to solve this concern, an additional operation, such as recovery, other than basic operations (for example, program/read/erase operations) and a peripheral circuit for the additional operation may be needed. Thus, there is a limitation in reducing the size of the nonvolatile memory device. For reference, the embedded memory occupies a relatively small area in comparison to a standalone memory having a several-GB capacity. Therefore, in order to reduce the size of the embedded memory, it is more important to reduce the area (or size) of peripheral circuits such as a decoder, a charge pump, a control logic and the like rather than the size of the embedded memory.

Furthermore, the conventional nonvolatile memory device uses hot carrier injection (HCI) during a program operation. However, the HCI has a concern in that the distribution of charges trapped in the charge trap layer 103 is wide, and non-uniform distribution of electrons and holes within the charge trap layer 103, that is, charge trap mismatch, occurs. Thus, reliability including endurance may be degraded.

Furthermore, the HCI consumes a large amount of current during a program operation, and requires a large-sized charge pump to supply the current. Thus, the HCI may not be suitable for being applied to the embedded memory.

SUMMARY

Various exemplary embodiments of the present invention are directed to a nonvolatile memory device that may reduce the area of a peripheral circuit, thereby reducing the entire area.

Also, various exemplary embodiments of the present invention are directed to a nonvolatile memory device that may perform a low-power operation while improving reliability.

In accordance with an exemplary embodiment of the present invention, a nonvolatile memory device includes a gate structure including a select gate formed over a substrate and a memory gate formed on one sidewall of the select gate and having a P-type channel, a drain region formed in the substrate at one sidewall of the gate structure and overlapping a part of the memory gate, and a source region formed in the substrate at the other sidewall of the gate structure and overlapping a part of the select gate.

In accordance with another exemplary embodiment of the present invention, a nonvolatile memory device includes a gate structure including a select gate formed over a substrate and a memory gate formed on one sidewall of the select gate, a drain region formed in the substrate at one sidewall of the gate structure and overlapping a part of the memory gate, a source region formed in the substrate at the other sidewall of the gate structure and overlapping a part of the select gate, and a contact structure formed over the gate structure and electrically merging the select gate and the memory gate.

In accordance with still another exemplary embodiment of the present invention, a nonvolatile memory device includes a gate structure including a select gate formed over a substrate and a memory gate formed on one sidewall of the select gate and having a P-type channel, a drain region formed in the substrate at one sidewall of the gate structure and overlapping a part of the memory gate, a source region formed in the substrate at the other sidewall of the gate structure and overlapping a part of the select gate, and a contact structure formed over the gate structure and electrically merging the select gate and the memory gate, wherein a contact area between the contact structure and the memory gate is substantially equal to a contact area between the contact structure and the select gate.

DETAILED DESCRIPTION

Figure 1:
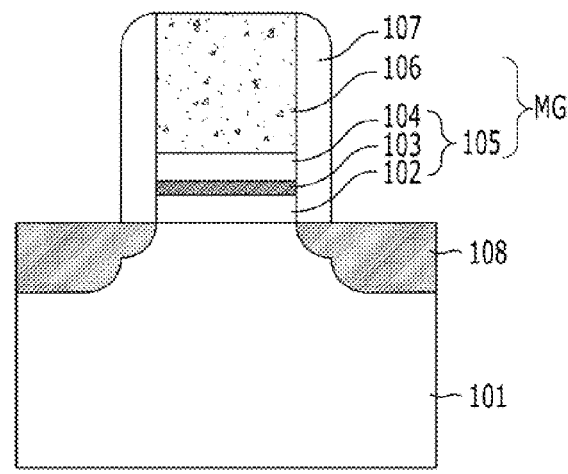
FIG. 1 is a cross-sectional view of a conventional nonvolatile memory device.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention.

The drawings are not necessarily to scale and in some instances, proportions may have been exaggerated in order to clearly illustrate features of the embodiments. It should be readily understood that the meaning of "on" and "over" in the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween.

The embodiments of the present invention provide a nonvolatile memory device that is easily applied to an embedded memory. In particular, the embodiments of the present invention provide a SONOS-type flash memory to which is most applicable to embedded memories. When the nonvolatile memory device is applied, the size (or area) of peripheral circuits may be reduced, and the size of the entire device may be reduced. As a result, it is possible to improve reliability and implement a low-power operation.

Figure 2A:
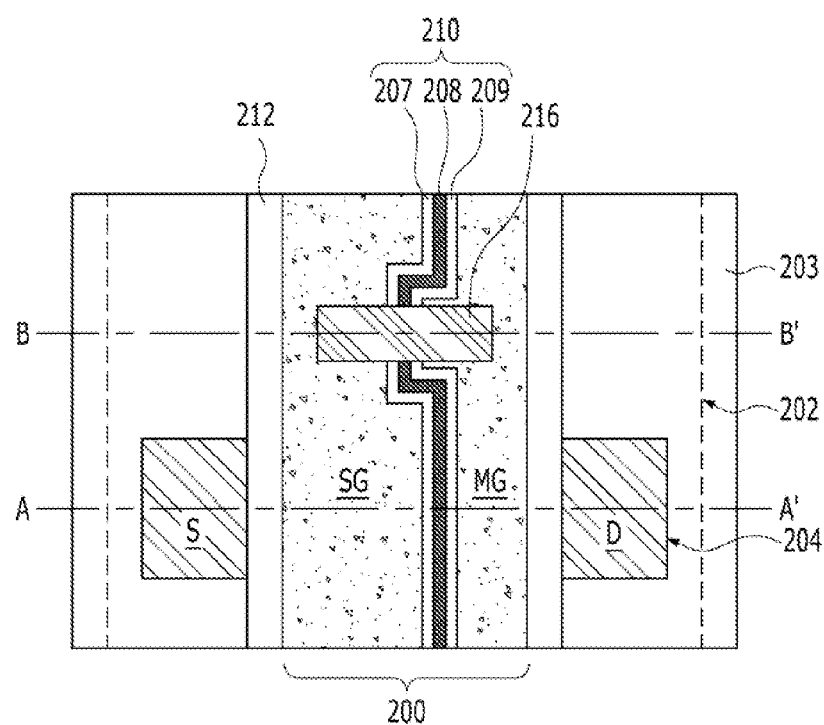
FIGS. 2A to 2C illustrate a nonvolatile memory device in accordance with an embodiment of the present invention.
Figure 2B:
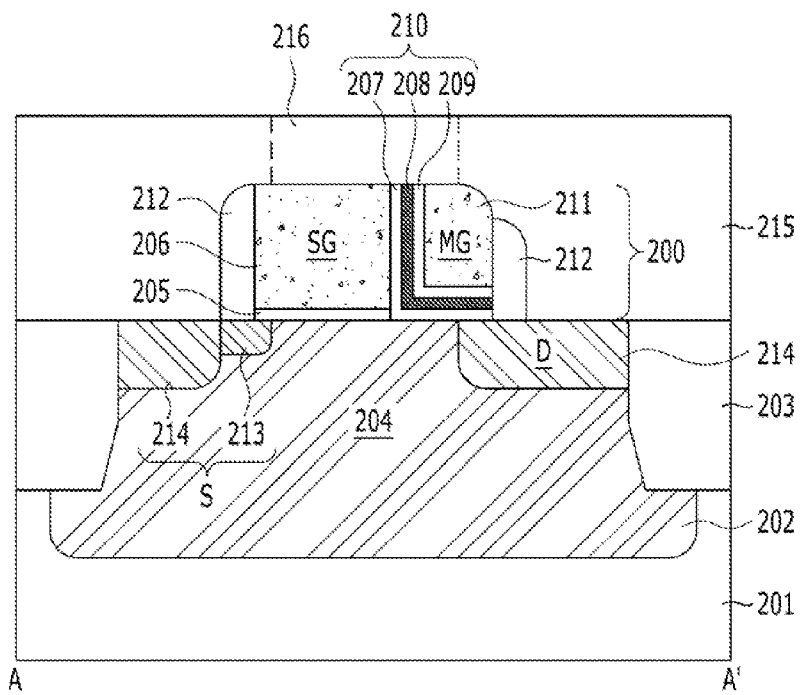
Figure 2C:
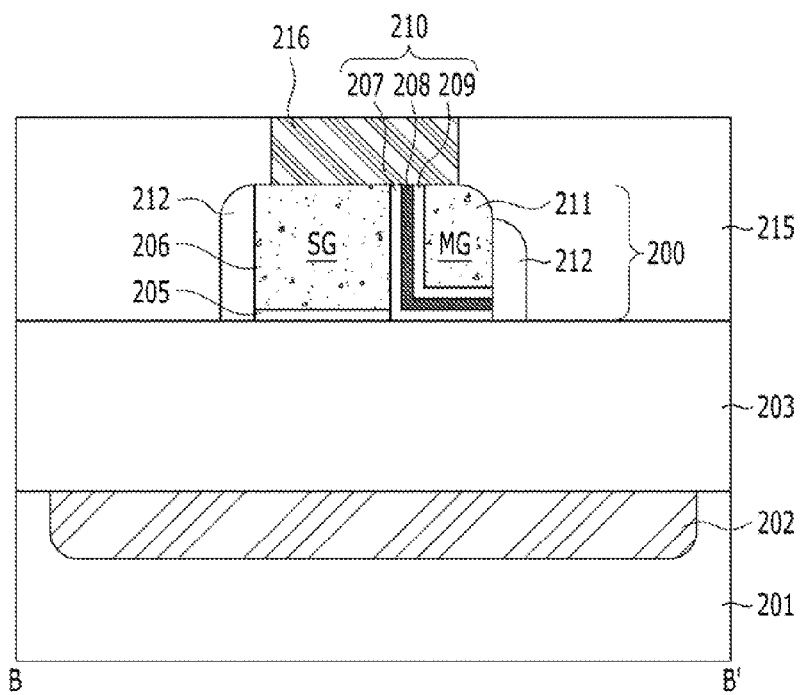

FIGS. 2A to 2C illustrate a nonvolatile memory device in accordance with an embodiment of the present invention. In particular, FIG. 2A is a plan view, and FIGS. 2A and 2B are cross-sectional views taken along lines A-A' and B-B' of FIG. 2A, respectively.

Referring to FIGS. 2A to 2C, the nonvolatile memory device in accordance with the embodiment of the present invention includes an N-type well 202 formed in a substrate 201. The substrate 201 may include a semiconductor substrate. The semiconductor substrate may have a single-crystal state, and may include a single-crystal silicon containing material. For example, the substrate 201 may include a silicon-on-insulator (SOI) substrate in which a bulk silicon substrate or support substrate, a buried insulation layer, and a single-crystal silicon layer are sequentially stacked. The N-type well 202 provides a base in which a nonvolatile memory device, particularly, a nonvolatile memory device having a P-type channel, may operate. The N-type well 202 may include an impurity region formed by implanting N-type impurities, for example, phosphorous (P) and/or arsenic (As).

The nonvolatile memory device in accordance with the embodiment of the present invention includes an isolation layer 203 that is formed in the substrate 201 having the N-type well 202 formed therein so as to define an active region 204. The isolation layer 203 may be formed through a shallow trench isolation (STI) process, and may include an insulator. The bottom surface of the N-type well 202 may be positioned under the bottom surface of the isolation layer 203. Depending on cases, the bottom surface of the N-type well 202 may be positioned over the bottom surface of the isolation layer 203 which separates the individual select gates. A part of the N-type well 202 may be opened by the isolation layer 203 and defined as an active region 204. The active region 204 may be formed in a bar type or a line type, having major and minor axes.

The nonvolatile memory device in accordance with the embodiment of the present invention includes a gate structure 200 including a select gate SG formed over the substrate 201 and a memory gate MG formed on one sidewall of the select gate SG and a spacer 212 formed on each sidewall of the gate structure 200. The gate structure 200 may have a bar-type pattern or a line-type pattern, crossing the active region 204 and the isolation layer 203 at the same time. The memory gate MG may be formed at one side of the select gate SG and have a spacer shape. Depending on characteristic requirements of the nonvolatile memory device, the memory gate MG and the select gate SG may have different channel lengths. Accordingly, the memory gate MG may have a critical dimension (CD) smaller than the select gate SG. Specifically, a control electrode 211 of the memory gate MG may have a smaller CD than a gate electrode 206 of the select gate SG. At this time, the CD of the memory gate MG and the CD of the select gate SG indicate CDs in the major-axis direction of the active region 204. The spacer 212 formed on each sidewall of the gate structure 200 may include any one single layer or a stacked layer of two or more layers selected from the group consisting of oxide, nitride, and oxynitride.

The select gate SG serves to prevent an over-erase. That is, as the nonvolatile memory device in accordance with the embodiment of the present invention includes the select gate SG, the nonvolatile memory device does not require an additional operation such as recovery and a peripheral circuit for the additional operation. The select gate SG may include a bar-type pattern or a line-type pattern, crossing the active region 204 and the isolation layer 203 at the same time. When seen from the plane, the sidewall of the select gate SG, contacted with the memory gate MG, may be partially recessed. That is, the select gate SG includes a concave portion having a relatively small CD. The concave portion of the select gate SG may be positioned over the isolation layer 203. The concave portion of the select gate SG serves to provide a uniform contact area between a contact structure to be described below, that is, a contact plug 216, and the select gate SG and the memory gate MG.

The select gate SG includes a gate dielectric layer 205 and a gate electrode 206 over the gate dielectric layer 205. The gate dielectric layer 205 may include any one single layer or a stacked layer of two or more layers selected from the group consisting of oxide, nitride, and oxynitride. The gate electrode 206 may include a silicon containing material or metal containing material.

The memory gate MG operates as a storage to store data, and may include a bar-type pattern or a line-type pattern, crossing the active region 204 and the isolation layer 203 at the same time. When seen from the plane, the sidewall of the memory gate MG, contacted with the select gate SG, may be partially projected in correspondence to the concave portion of the select gate SG. That is, the memory gate MG may include a convex portion having a relatively large CD. The convex portion of the memory gate MG may be coupled to the concave portion on each side of the contact plug 216 of the select gate SG. Although the memory gate MG and the select gate SG have different CDs, the convex portion of the memory gate MG and the concave portion of the select gate SG may have the same CD. This is in order to provide a uniform contact area between the contact plug 216 and the select gate SG and the memory gate MG. The convex portion of the memory gate MG may be positioned over the isolation layer 203 like the concave portion of the select gate SG. This is in order to stably form the contact plug 216 contacted with the convex portion of the memory gate MG and the concave portion of the select gate SG and to prevent characteristic degradation caused by process variables occurring when the contact plug 216 is formed.

The memory gate MG includes a memory layer 210 and a control electrode 211 over the memory layer 210. The memory layer 210 not only may be interposed between the substrate 201 and the control electrode 211, but may be interposed between the control electrode 211 and the select gate SG. That is, the memory layer 210 may have an L-shape, as shown in FIG. 2A. The memory layer 210 includes a stacked layer in which a tunnel insulation layer 207, a charge trap layer 208, and a charge blocking layer 209 are sequentially stacked. Each of the tunnel insulation layer 207, the charge trap layer 208, and the charge blocking layer 209 may include a single layer or a stacked layer of two or more layers selected from the group consisting of oxide, nitride, and oxynitride. For example, the tunnel insulation layer 207 and the charge blocking layer 209 may be formed of oxide, and the charge trap layer 209 may be formed of nitride. That is, the memory layer 210 may have an oxide-nitride-oxide (ONO) structure. The control electrode 211 over the memory layer 210 serves as a control gate for the memory layer 210. Thus, the control electrode 211 may trap electrons or holes in the charge trap layer 208 of the memory layer 210 or de-trap electrons or holes from the charge trap layer 208 of the memory layer 210, in response to a bias applied to the control electrode 211. The control electrode 211 may include a silicon containing material or a metal containing material.

The nonvolatile memory device in accordance with the embodiment of the present invention includes a drain region D formed in the active region 204 at one side of the gate structure 200 and a source region S formed in the active region 204 at the other side of the gate structure 200. The drain region D may be formed in the active region 204 adjacent to the memory gate MG so as to overlap a part of the memory gate MG, and the source region S may be formed in the active region 204 adjacent to the select gate SG so as to overlap a part of the select gate SG. As described below in an operation of a unit cell, a bend-to-bent tunneling (BTBT) may be used instead of the HCI during a program operation, because the memory gate MG and the drain region D overlap each other. Thus, the current consumption may be significantly reduced during a program operation, and the area of the charge pump may be significantly reduced.

Since the nonvolatile memory device in accordance with the embodiment of the present invention has a P-type channel, the source region S and the drain region D may have a P-type conductivity, and may include a P-type impurity formed in the N-type well 202. At this time, the source area S and the drain region D may have an asymmetrical structure. Specifically, the source region S may have a lightly doped drain (LDD) structure including a first impurity region 213 and a second impurity region 214 having a larger impurity doping concentration than the first impurity region 213, and the drain region D may include, for example, only the second impurity region 214. When the drain region D overlapping underneath the memory gate MG is formed with a high-concentration impurity region including, for example, only the second impurity region 214 instead of the LDD structure including the first and second impurity regions 213 and 214, a program operation may be more easily performed, and resistance may be decreased to thereby reduce current consumption during the program operation.

The nonvolatile memory device in accordance with the embodiment of the present invention includes a contact structure that electrically connects the select gate SG and the memory gate MG. The contact structure includes a contact plug 216 contacted with both of the select gate SG and the memory gate MG through the interlayer dielectric layer 215 that is formed over the substrate 201 so as to cover the gate structure 200. The contact structure, that is, the contact plug 216, serves to electrically merge the select gate SG and the memory gate MG such that the same signal as a signal applied to the select signal SG is applied to the memory gate MG at the same time. When the select gate SG and the memory gate MG are electrically merged, the operation may be simplified more than when a signal is applied from each of the select gate SG and the memory gate MG. Furthermore, since a select-gate decoder and a memory-gate decoder may be merged into one decoder, the size of the peripheral circuit including the decoder may be significantly reduced.

The contact plug 216 may be formed in a rectangular-pillar shape or an elliptical-pillar shape, having major and minor axes. This is in order to not only easily merge the select gate SG and the memory gate MG using the contact plug 216, but also stably deal with overlay change during a photolithography process.

The contact area between the contact plug 216 and the select gate SG may be equal to the contact area between the contact plug 216 and the memory gate MG. Specifically, the contact area between the contact plug 216 and the gate electrode 206 of the select gate SG may be equal to the contact area between the contact plug 216 and the control electrode 211 of the memory gate MG. Therefore, the contact plug 216 may be disposed at a position corresponding to the concave portion of the select gate SG and the convex portion of the memory gate MG where the CD of the select gate SG is equal to the CD of the memory gate MG. This is in order to uniformly maintain resistance between the contact plug 216 and the select gate SG and the memory gate MG although the select gate SG and the memory gate MG have different CDs depending on characteristic requirements of the device (for example, channel length), thereby preventing characteristic degradation.

As the nonvolatile memory device having the above-described structure includes the select gate SG, the nonvolatile memory device may prevent an over-erase without an additional operation such as recovery and a peripheral circuit for the additional operation. Thus, it is possible to reduce the size of the peripheral circuit. Furthermore, the memory gate MG and the drain region D partially overlap each other such that the program operation may be performed without using the HCI. Thus, it is possible to reduce current consumption during the program operation, thereby reducing the size of the peripheral circuit including the charge pump. Furthermore, as the nonvolatile memory device includes the contact structure to electrically merge the select gate SG and the memory gate MG, it is possible to reduce the size of the peripheral circuit including a decoder while simplifying the operation.

Since the charge trapping and de-trapping is limited to the region where the memory gate MG and the drain region D overlap each other during the program operation and the erase operation, the nonvolatile memory device may easily control the distribution of charges trapped in the charge trap layer 208, thereby preventing characteristic degradation caused by charge trap mismatch. Therefore, it is possible to prevent the degradation of reliability including endurance.

Hereafter, the operation of the nonvolatile memory device in accordance with the embodiment of the present invention will be described with reference to FIGS. 2A to 2C and Table 1. Table 1 shows an example of operation conditions of the nonvolatile memory device in accordance with the embodiment of the present invention.

TABLE 1

| Operation | Scheme | Select gate & memory gate | Drain region | Source region | N-type well |
|---|---|---|---|---|---|
| Program | BTBT | VPP | −VPP | VSS | VSS |
| Erase | FN tunneling | −VPP | VPP | VPP | VPP |
| Read | Forward | −VCC | Vread(∼−1 V) | VSS | VSS |

The program operation may use a bend-to-bent tunneling (BTBT). Specifically, since the nonvolatile memory device in accordance with the embodiment of the present invention has a P-type channel, the program operation may be performed through BTBT-induced hot electron injection. The BTBT has lower current consumption than the HCI. When the BTBT is used, the program operation may be performed at a lower voltage than when the HCI is used. Thus, the size of the charge pump to supply a current may be significantly reduced in comparison to the HCI.

More specifically, when a first program voltage is applied to the select gate SG and the memory gate MG through the contact structure, that is, the contact plug 216, a second program voltage having the opposite polarity of the first program voltage may be simultaneously applied to the drain region D, in order to perform the program operation. At this time, the first program voltage may include a positive voltage, and the second program voltage may include a negative voltage. For example, the first program voltage may include a pumping voltage VPP, and the second program voltage may include a negative pumping voltage −VPP. Furthermore, a ground voltage VSS may be applied to the source area S and the N-type well 202.

When the pumping voltage VPP is applied to the memory gate MG and the negative pumping voltage −VPP is applied to the drain region D overlapping the memory gate MG, BTBT occurs in an area where the memory gate MG and the drain region D overlap each other, due to a potential difference between the memory gate MG and the drain region D, and hot electrons generated by the occurrence of BTBT between the memory gate MG and the drain region D are trapped in the charge trap layer 208 of the memory gate MG. According to the series of mechanisms, the program operation may be performed. During the program operation, electrons trapped in the charge trap layer 208 are limited to the area where BTBT occurs, that is, the area where the memory gate MG and the drain region D overlap each other. Therefore, it is possible to prevent the degradation in reliability of the nonvolatile memory device, caused by non-uniform charge distribution and charge trap mismatch within the charge trap layer 208. Furthermore, since the drain region D includes, for example, only the second impurity region 214 having a relatively high impurity doping concentration, hot electrons may be easily generated through the occurrence of BTBT, and resistance of the drain region D to which a voltage for the program operation is applied may be reduced.

The erase operation may use FN tunneling. Specifically, the erase operation may be performed by applying a first erase voltage to the select gate SG and the memory gate MG and applying a second erase voltage having the opposite polarity of the first erase voltage to the source region S, the drain region D, and the N-type well 202. At this time, the first erase voltage may include a negative voltage, and the second erase voltage may include a positive voltage. For example, the first erase voltage may include a negative pumping voltage −VPP, and the second erase voltage may include a pumping voltage VPP. Since the nonvolatile memory device according to the embodiment of the present invention has a P-type channel, the nonvolatile memory device may easily apply a positive voltage to the N-type well 202. When the negative pumping voltage −VPP is applied to the memory gate MG and the pumping voltage VPP is applied to the N-type well 202 including the source region S and the drain region D, the erase operation may be performed through FN tunneling caused by a potential difference therebetween.

The read operation may use the forward read scheme in which the read operation is performed through charge migration in the same direction as the migration direction of charges during the program operation. Specifically, the read operation may be performed by applying an enable voltage to the select gate SG and the memory gate MG and applying a read voltage Vread and a ground voltage VSS to the drain region D and the source region S, respectively. The enable voltage and the read voltage Vread may include a negative voltage. The enable voltage may include, for example, a negative power supply voltage −VCC, that is, a voltage that may induce a channel under the select gate SG and control a channel under the memory gate MG according to whether or not charges are trapped in the charge trap layer 208. The read voltage Vread may be used to determine whether or not a channel is formed under the memory gate MG according to whether or not charges exist in the charge trap layer 208. The read voltage Vread may have a magnitude of ∼−1V.

Hereafter, a method for fabricating the nonvolatile memory device having the above-described structure will be described with reference to FIGS. 3A to 3E, FIGS. 4A to 4E, and FIGS. 5A to 5E. In the following descriptions, components represented by the same terms correspond to the same components as those described with reference to FIGS. 2A to 2C even though they are represented by different reference numerals. Thus, the detailed descriptions thereof are omitted.

FIGS. 3A to 3E, FIGS. 4A to 4E, and FIGS. 5A to 5E are diagrams illustrating a method for fabricating a unit cell of the nonvolatile memory device according to the embodiment of the present invention. FIGS. 3A to 3E are plan views showing progressive buildup from substrate to top of gate surfaces and contact plugs. FIGS. 4A to 4E and FIGS. 5A to 5E are cross-sectional views taken along lines A-A' and B-B' of right half of FIGS. 3A to 3E, respectively.

Figure 3A:
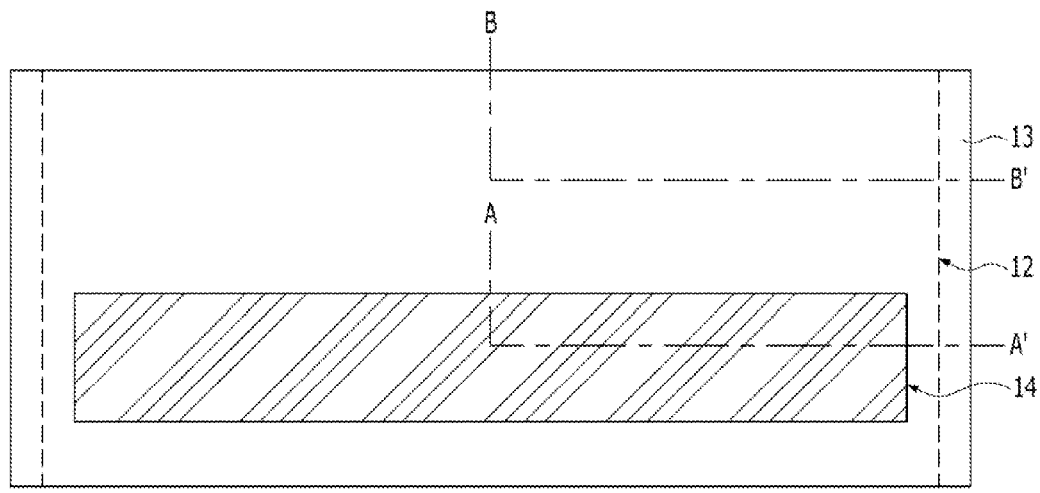
FIGS. 3A to 3E, FIGS. 4A to 4E, and FIGS. 5A to 5E illustrate a method for fabricating a unit cell of the nonvolatile memory device according to the embodiment of the present invention.
Figure 4A:
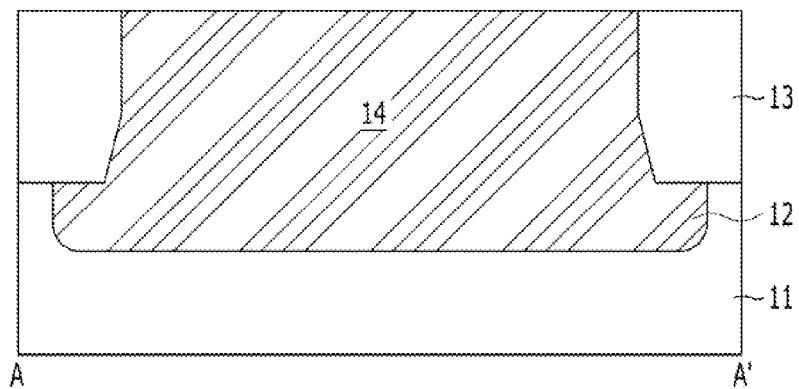
Figure 5A:
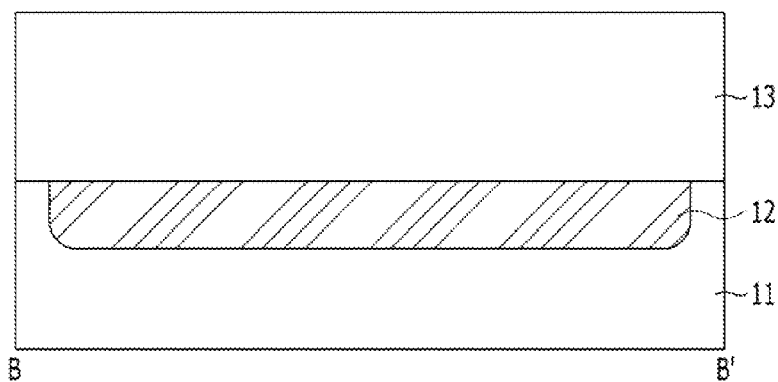

Referring to FIGS. 3A, 4A, and 5A, a substrate 11 is prepared. The substrate 11 may include a semiconductor substrate. The semiconductor device may have a single crystal state, and may include a single-crystal silicon containing material. For example, the substrate 11 may include a bulk silicon substrate or SOI substrate.

Then, a mask pattern (not illustrated) is formed over the substrate 11, and an N-type well 12 is formed by implanting N-type impurities into the substrate 11 using the mask pattern as an ion implant barrier. The N-type well 12 is a component for providing a nonvolatile memory device having a P-type channel, and may be formed by implanting P and/or As.

Then, an isolation layer 13 is formed in the substrate 11 so as to define an active region 14. The active region 14 may be defined by opening a part of the N-type well 12 formed in the substrate 11 through the isolation layer 13, and a plurality of unit cells may be formed to share one active region 14. The isolation layer 13 may be formed through an STI process. The STI process indicates a series of processes of forming a trench for isolation and gap-filling the trench with an insulator to form the isolation layer 13.

Figure 3B:
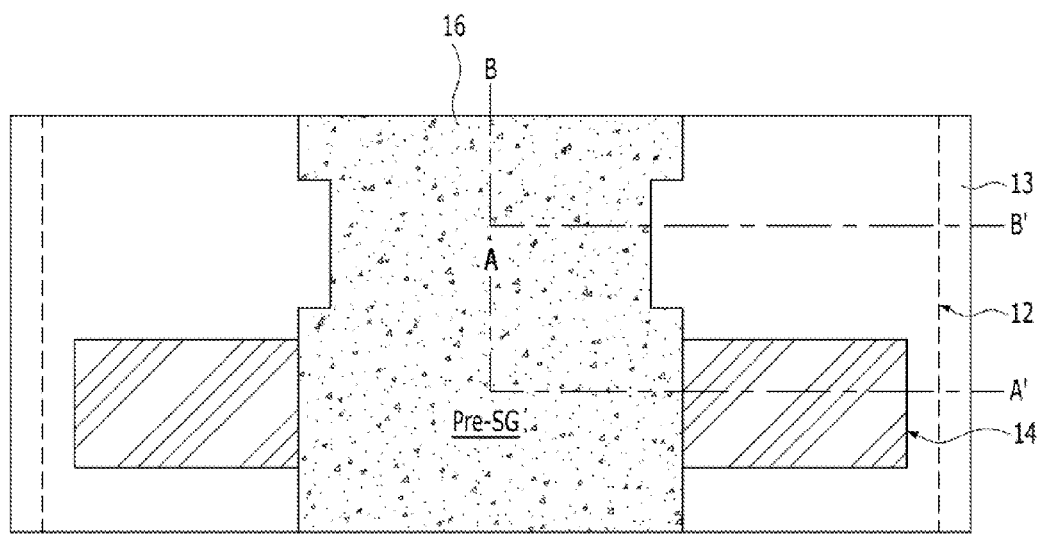
Figure 4B:
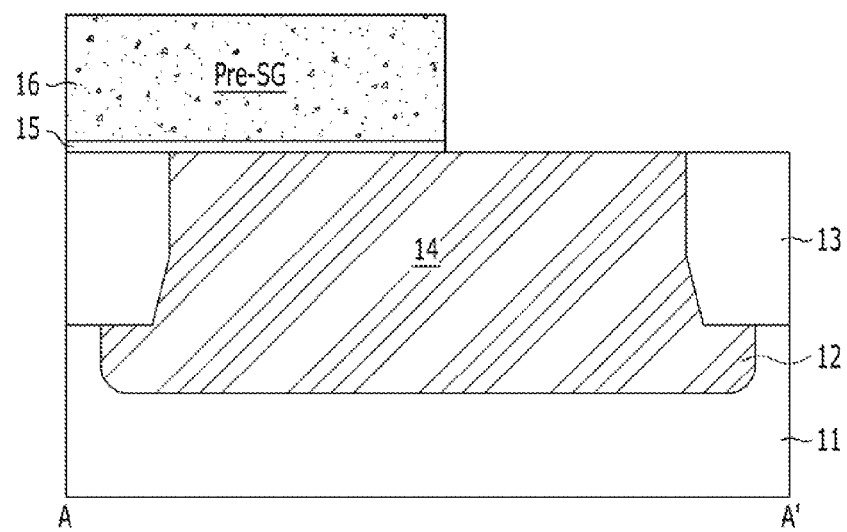
Figure 5B:
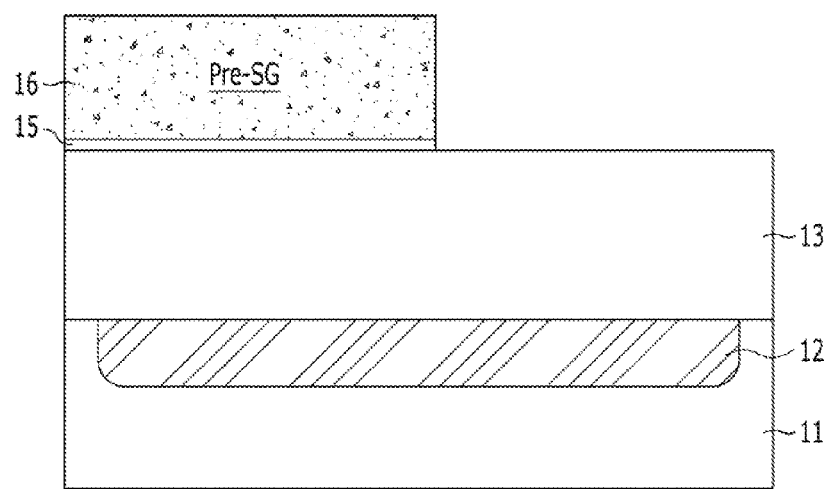

Referring to FIGS. 3B, 4B, and 5B, a pre-select gate Pre-SG is formed over the substrate 11. The pre-select gate Pre-SG may be formed in a bar-type pattern or a line-type pattern, crossing the active region 14 and the isolation layer 13 at the same time The pre-select gate Pre-SG may be formed to include a concave portion having a relatively small CD. At this time, the concave portion may be positioned over the isolation layer 13.

The pre-select gate Pre-SG is formed with a stacked structure including a gate dielectric layer 15 and a gate electrode 16 over the gate dielectric layer 15. The gate dielectric layer 15 may include any one single layer or a stacked layer of two or more layers selected from the group consisting of oxide, nitride, and oxynitride. The gate electrode 16 may be formed of a silicon containing material and/or a metal containing material. The pre-select gate Pre-SG may be formed through a series of processes of sequentially forming a gate conductive layer (not illustrated) and a mask pattern (not illustrated) and etching the gate conductive layer and the gate dielectric layer 15 using the mask pattern as an etch barrier.

Figure 3C:
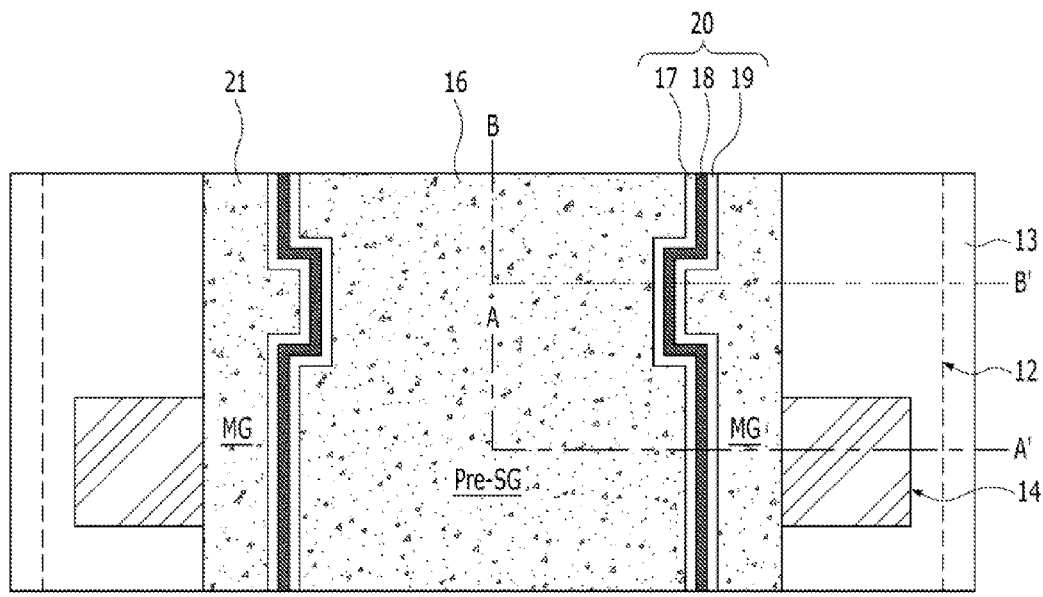
Figure 4C:
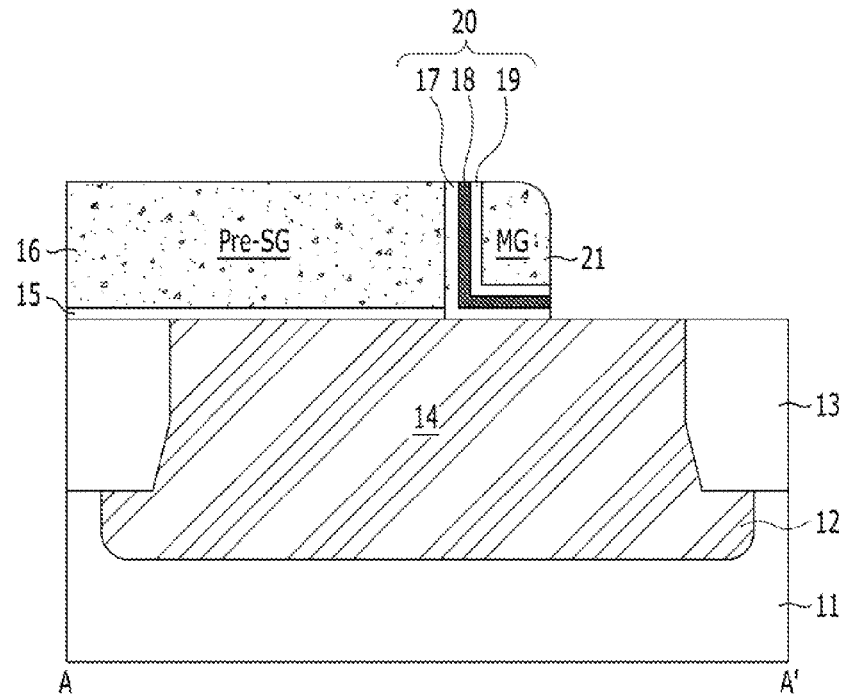
Figure 5C:
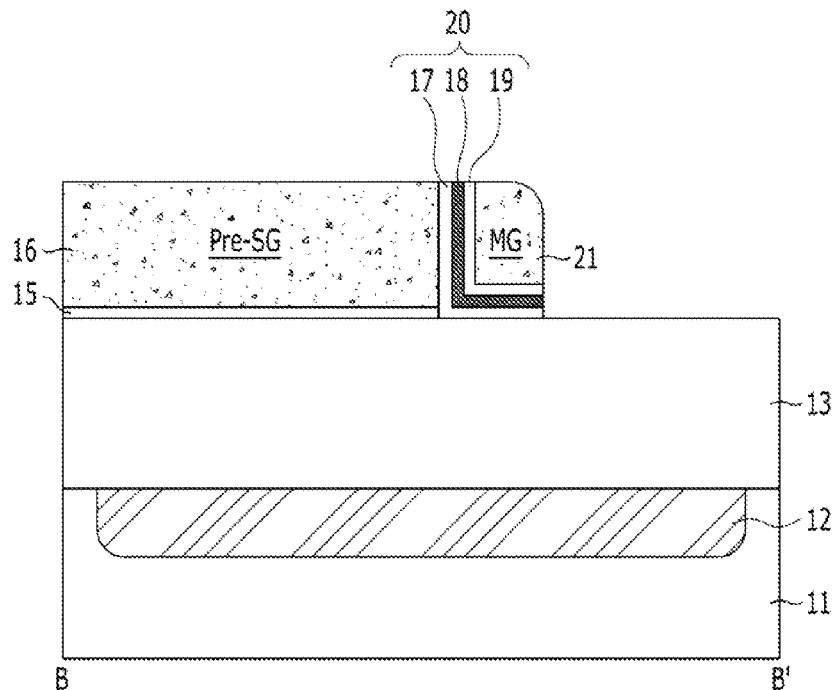

Referring to FIGS. 3C, 4C, and 5C, a memory layer 20 is formed along the surface of the structure including the pre-select gate Pre-SG. The memory layer 20 may be formed to maintain the profile of the pre-select gate Pre-SG including the concave portion. The memory layer 20 is formed with a stacked layer in which a tunnel insulating layer 17, a charge trap layer 18, and a charge blocking layer 19 are sequentially stacked. The tunnel insulating layer 17, the charge trap layer 18, and the charge blocking layer 19 may include any one single layer or a stacked layer of two or more layers selected from the group consisting of oxide, nitride, and oxynitride. For example, the tunnel insulating layer 17 and the charge blocking layer 19 may be formed of oxide, and the charge blocking layer 19 may be formed of nitride. That is, the memory layer 20 may be formed of an ONO layer.

Then, a gate conductive layer (not illustrated) is formed over the memory layer 20, and a blanket process, for example, an etch-back process is performed to form a memory gate MG including a memory layer 20 and a control electrode 21, on each sidewall of the pre-select gate Pre-SG. The memory gate MG may be formed to have a convex portion corresponding to the concave portion of the select gate SG, while the outer profile thereof has a straight profile. This structure may be implemented by adjusting the deposition thickness during the formation process of the gate conductive layer.

Figure 3D:
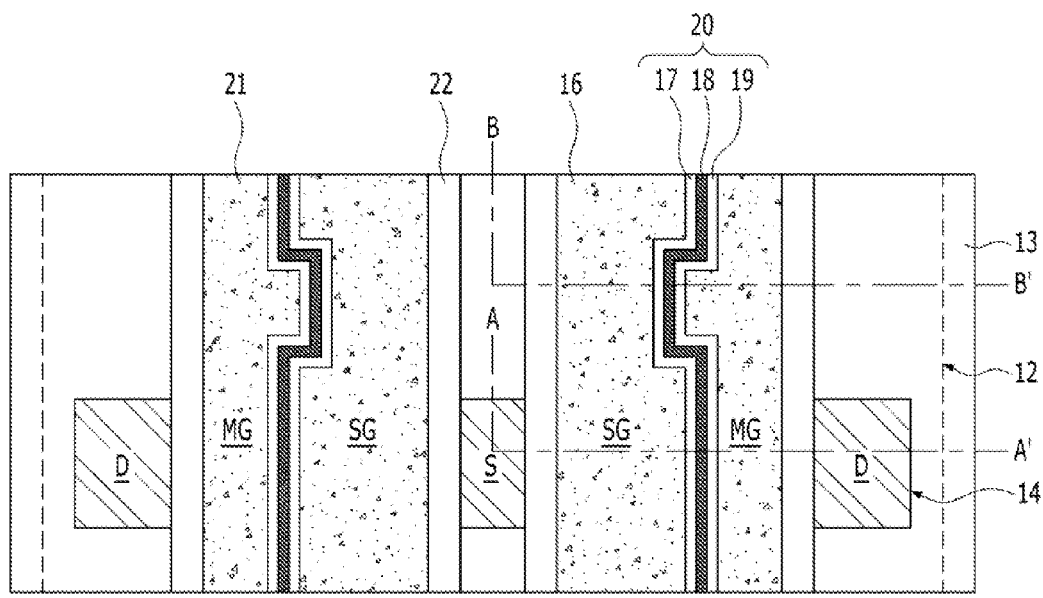
Figure 4D:
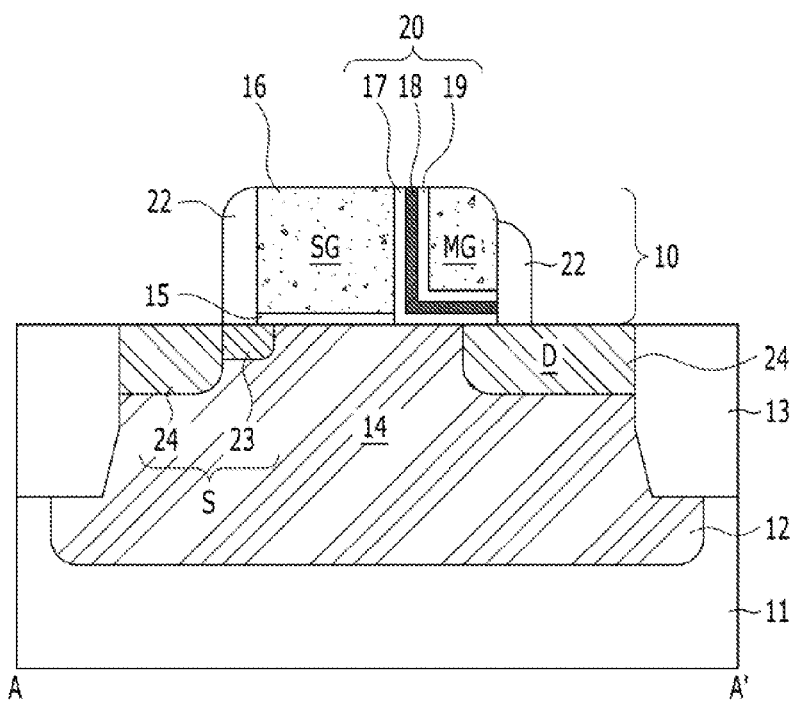
Figure 5D:
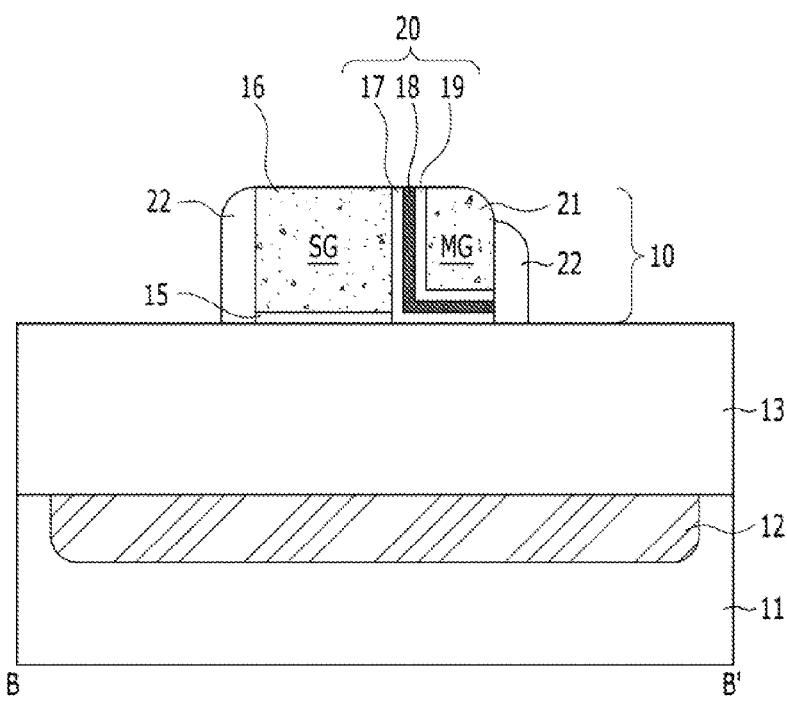

Referring to FIGS. 3D, 4D, and 5D, the pre-select gate Pre-SG is selectively etched to form a selecting gate SG corresponding to each unit cell. That is, as the pre-select gate Pre-SG is selectively etched to isolate adjacent select gates SG, a plurality of gate structures 10 may be formed. Each of the gate structures 10 includes the select gate SG and the memory gate MG formed on one sidewall of the select gate SG.

Then, a spacer 22 is formed on each sidewall of the gate structure 10, and a source region S and a drain region D are formed in the active region 14 at both sides of the gate structure 10. At this time, depending on the shapes of the source region S and the drain region D, the formation sequence of the spacer 22 may be controlled, and adjacent unit cells may share the source region S, FIG. 4D.

The spacer 22 may include any one single layer or a stacked layer of two or more layers selected from the group consisting of oxide, nitride, and oxynitride. The source region S and the drain region D may be formed by, for example, implanting P-type impurities into the N-type well 12. The source region S may be formed to partially overlap the select gate SG, and the drain region D may be formed to partially overlap the memory gate MG. The source region S may be formed with a LDD structure including a first impurity region 23 and a second impurity region 24 having a higher impurity doping concentration than the first impurity region 23, and the drain region D may be formed with the second impurity region 24. That is, the source region S and the drain region D may have an asymmetrical structure.

Figure 3E:
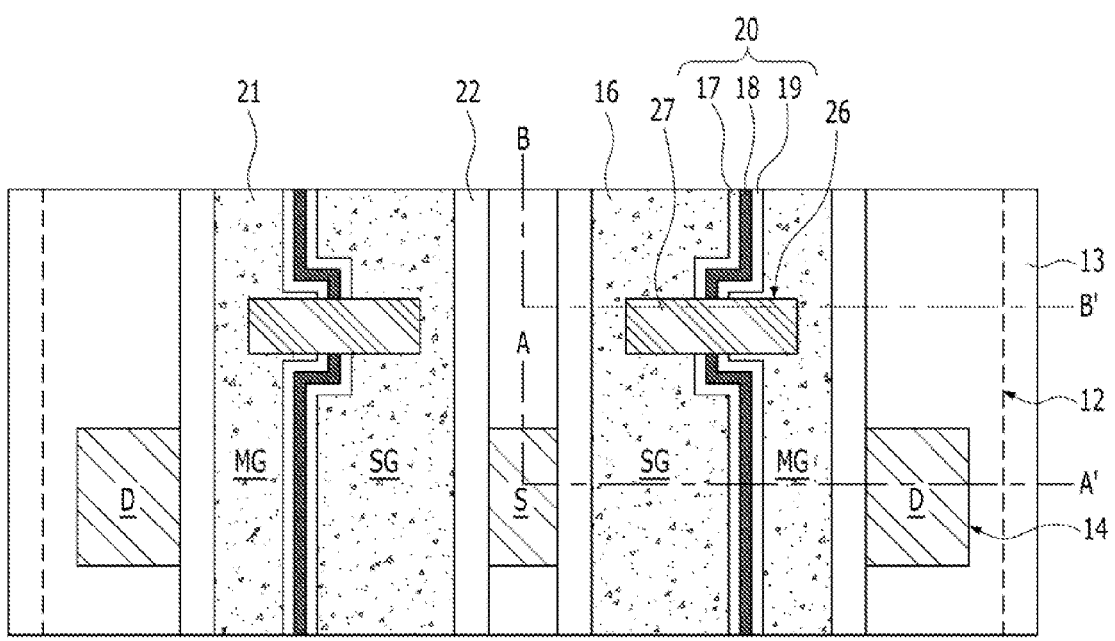
Figure 4E:
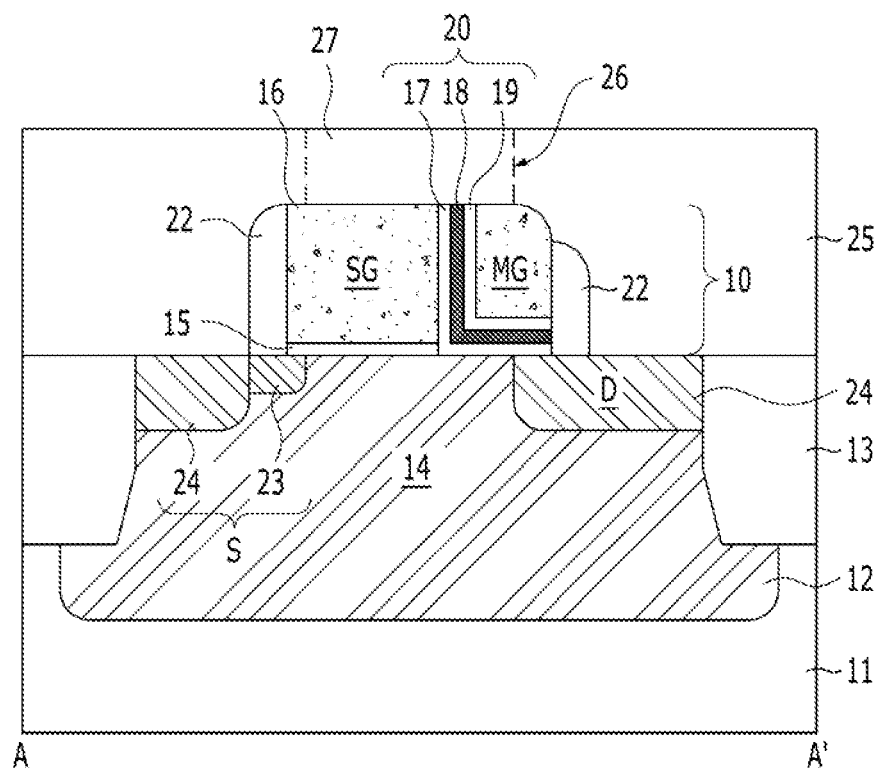
Figure 5E:
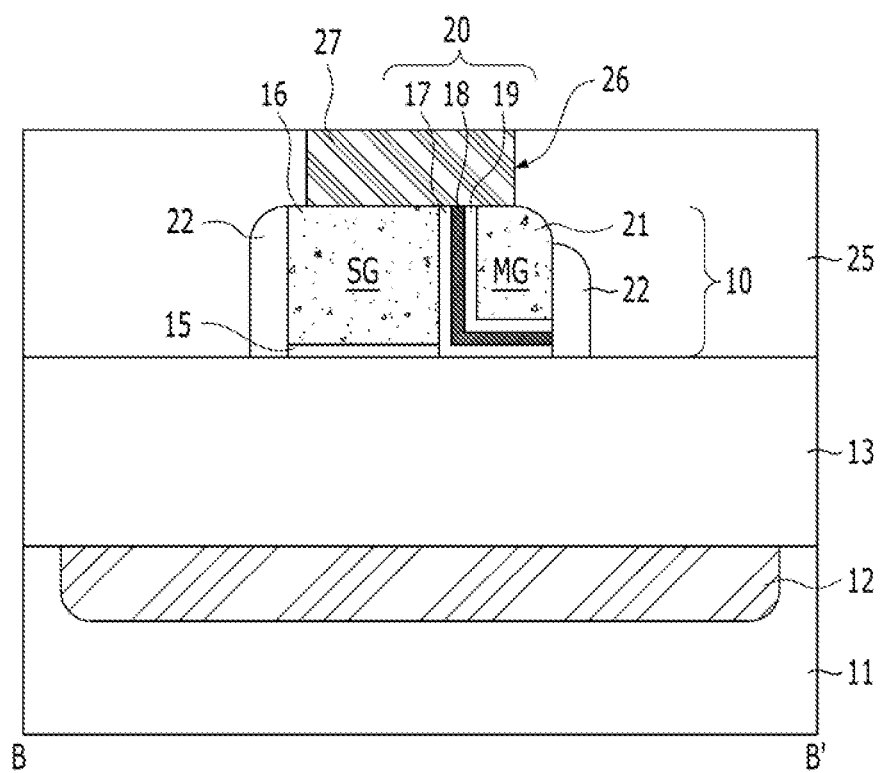

Referring to FIGS. 3E, 4E, and 5E, an interlayer dielectric layer 25 is formed on the entire surface of the substrate 11 so as to cover the gate structure 10. The interlayer dielectric layer 25 may include any one single layer or a stacked layer of two or more layers selected from the group consisting of oxide, nitride, and oxynitride.

Then, a mask pattern (not illustrated) is formed over the interlayer dielectric layer 25. As the mask pattern is used as an etch barrier to etch the Interlayer dielectric layer 25, a contact hole 26 is formed to expose the select gate SG and the memory gate MG at the same time. At this time, the contact hole 26 may be formed in a rectangular shape or an elliptical shape, having major and minor axes, and the area of the select gate SG exposed through the contact hole 26 may be set to be equal to the area of the memory gate MG exposed through the contact hole 26. Specifically, the area of the gate electrode 16 of the select gate SG exposed through the contact hole 26 may be set to be equal to the area of the control electrode 21 of the memory gate MG exposed through the contact hole 26. For this structure, the interlayer dielectric layer 25 over the isolation layer 13 may be etched to form the contact hole 26 at a position corresponding to the concave portion of the select gate SG and the convex portion of the memory gate MG.

The contact hole 26 is filled with a conductive material to form a contact plug 27, FIG. 4E. At this time, the contact plug 27 serves as a contact structure to electrically merge the select gate SG and the memory gate MG.

Then, although not illustrated, a plug structure, a conductive line and the like, which are connected to the contact plug 27, the source region S, and the drain region D are formed through known semiconductor fabrication techniques. Then, the nonvolatile memory device is completed.

Hereafter, an example of application fields of the nonvolatile memory device in accordance with the embodiment of the present invention will be described briefly with reference to FIGS. 6 and 7.

Figure 6:
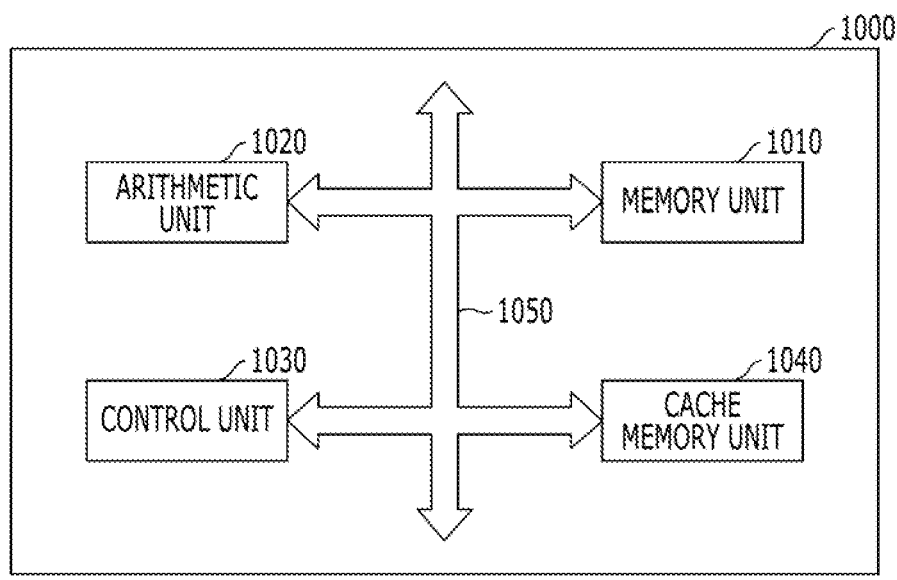
FIG. 6 is a configuration diagram of a microprocessor in accordance with an embodiment of the present invention.

FIG. 6 is a configuration diagram of a microprocessor in accordance with an embodiment of the present invention.

Referring to FIG. 6, the microprocessor 1000 may control a series of processes of receiving data from various external devices, processing the received data, and then transmitting the processed data to the external devices. The microprocessor 1000 may include a memory unit 1010, an arithmetic unit 1020, and a control unit 1030. In addition, the microprocessor 1000 may include various processors such as a central processing unit (CPU), a graphic processing unit (GPU), a digital signal processor (DSP), an application processor (AP) and the like.

The memory unit 1010 is configured to store data as a processor register or register in the microprocessor 1000. The memory unit 1010 may include a data register, an address register, and a floating-point register. In addition, the memory unit 1010 may include various registers. The memory unit 1010 may serve to temporarily store data calculated by the arithmetic unit 1020 or result data and an address at which the data are stored.

The memory unit 1010 may include the above-described nonvolatile memory device. The memory unit 1010 including the nonvolatile memory device in accordance with the embodiment of the present invention includes a gate structure including a select gate over a substrate and a memory gate formed on one sidewall of the select gate and having a P-type channel. In addition, the memory unit 1010 includes a drain region formed in a substrate at one side of the gate structure and overlapping a part of the memory gate, a source region formed in the substrate at the other side of the gate structure and overlapping a part of the select gate, and a contact structure electrically merging the select gate and the memory gate and having the same contact area with the memory gate as a contact area with the select gate. The memory unit 1010 may reduce the size of a peripheral circuit to thereby reduce the size of the device, and may prevent the degradation of reliability including endurance. Through this structure, the size of the memory unit 1010 may be minimized, and the capacity of the memory unit 1010 may be maximized within the same area. In order to reduce the size of the microprocessor 1000, a small-sized memory unit 1010 is required. Furthermore, in order to increase the performance of the microprocessor 1000, the reliability of the memory unit 1010 may need to be improved. Since the memory unit 1010 in accordance with the embodiment of the present invention may improve the reliability while minimizing the size, it is possible to not only reduce the size of the microprocessor 1000 but also improve the performance of the microprocessor 1000.

The arithmetic unit 1020 is configured to perform an arithmetic operation inside the microprocessor 1000. The arithmetic unit 1020 performs the four fundamental arithmetic operations or logic operations according to a result obtained by decoding a command through the control unit 1030. The arithmetic unit 1020 may include one or more arithmetic and logic units (ALU).

The control unit 1030 is configured to receive a signal from an external device such as the memory unit 1010, the arithmetic unit 1020, or the microprocessor 1000, extract or decode a command, control input/output, and execute a programmed process.

The microprocessor 1000 in accordance with the embodiment of the present invention may additionally include a cache memory unit 1040 configured to temporarily store data to be inputted to or outputted from an external device, in addition to the memory unit 1010. In this case, the cache memory unit 1040 may exchange data with the memory unit 1010, the arithmetic unit 1020, and the control unit 1030 through a bus interface 1050.

Figure 7:
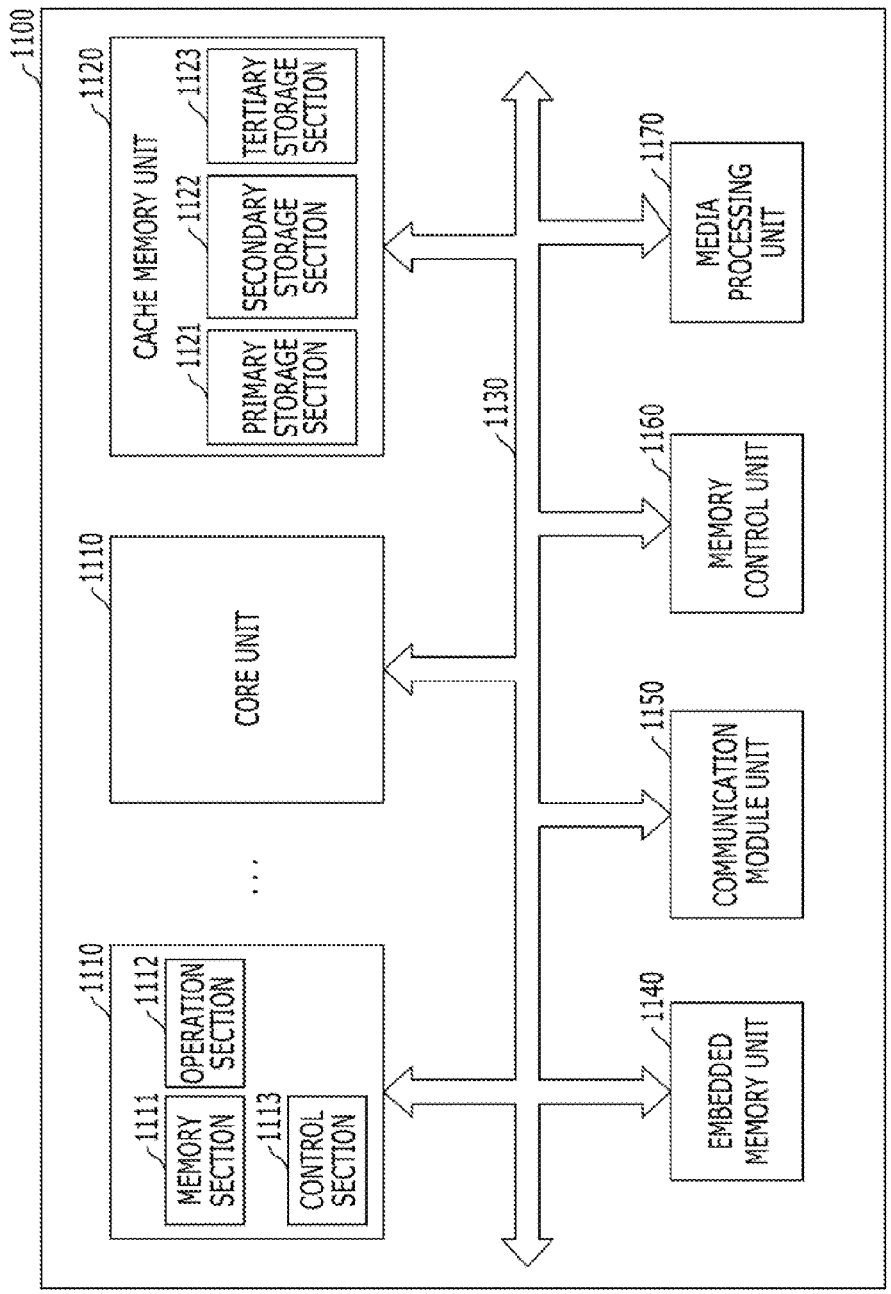
FIG. 7 is a configuration diagram of a processor in accordance with an embodiment of the present invention.

FIG. 7 is a configuration diagram of a processor in accordance with an embodiment of the present invention.

Referring to FIG. 7, the processor 1100 may include various functions other than the functions of the microprocessor to control a series of processes of receiving data from various external devices, processing the received data, and then transmitting the processed data to the external devices, thereby improving performance and implementing multiple functions. The processor 1100 includes a core unit 1110, a cache memory unit 1120, and a bus interface 1130. The core unit 1110 in accordance with the embodiment of the present invention is configured to perform arithmetic and logic operations on data inputted from an external device, and may include a memory section 1111, an arithmetic section 1112, and a control section 1113. The processor 1100 may include a multi-core processor, a GPU, an application processor (AP), various systems on chip (SoC) and the like.

The memory section 1111 is configured to store data as a processor register or register inside the processor 1100, and include a data register, an address register, and a floating-point register. In addition, the memory section 1111 may include various registers. The memory section 1111 may serve to temporarily store data calculated by the arithmetic section 1112 or result data and an address at which the data are stored. The arithmetic section 1112 is configured to perform an operation inside the processor 1100, and performs the four fundamental arithmetic operations or logic operations according to a result obtained by decoding a command through the control section 1113. The arithmetic section 1112 may include one or more arithmetic and logic units (ALU). The control section 1113 is configured to receive a signal from the memory section 1111, the arithmetic section 1112, or an external device of the microprocessor 1100, extract or decode a command, control input/output, and execute a programmed process.

The cache memory unit 1120 is configured to temporarily store data in order to compensate for a difference in data processing speed of a low-speed external device, unlike the core unit 1110 operating at high speed, and may include a primary storage section 1121, a secondary storage section 1122, and a tertiary storage section 1123. The cache memory unit 1120 basically includes the primary and secondary storage sections 1121 and 1122. When a high capacity is required, the cache memory unit 1120 may further include the tertiary storage section 1123. That is, the number of storage sections included in the cache memory unit 1102 may differ depending on design. The primary to tertiary storage sections 1121 to 1123 may store and determine data at the same speed or different speeds. When the respective storage sections have different processing speeds, the first storage section may have the highest processing speed. FIG. 8 illustrates a case in which all of the primary to tertiary storage sections 1121 to 1123 are provided inside the cache memory unit 1120. However, all of the first to third storage sections 1121 to 1123 may be provided outside the core unit 1110, and may compensate for a difference in processing speed between the core unit 1110 and the external device. Furthermore, the primary storage section 1121 of the cache memory unit 1120 may be positioned inside the core unit 1110, and the secondary and tertiary storage sections 1122 and 1123 may be positioned outside the core unit 1110 so as to strengthen the function of improving the processing speed.

The bus interface 1130 is configured to connect the core unit 1110 and the cache memory unit 1120 so as to effectively transmit data.

The processor 1100 in accordance with the embodiment of the present invention may include a plurality of core units 1110, and the plurality of core units 1110 may share the cache memory unit 1120. The plurality of core units 1110 and the cache memory unit 1120 may be connected through the bus interface 1130. The plurality of core units 1110 may be configured in the same manner as the above-described core unit. When the processor 1100 includes the plurality of core units 1110, an equal number of primary storage sections 1121 may be provided in the respective core units 1110, and the secondary and tertiary storage sections 1122 and 1123 may be provided as one storage section outside the plurality of core units 1110 and shared through the bus interface 1130. The primary storage section 1121 may have a higher processing speed than the secondary and tertiary storage sections 1122 and 1123.

The processor 1100 in accordance with the embodiment of the present invention may further include an embedded memory unit 1140 configured to store data, a communication module unit 1150 configured to transmit/receive data to and from an external device in a wired or wireless manner, a memory control unit 1160 configured to drive an external memory device, and a media processing unit 1170 configured to process data processed by the processor 1100 or data inputted from the external input device and output the processed data to an external interface device. In this case, the additional modules may exchange data with the core unit 1110 and the cache memory unit 1120 through the bus interface 1130, and may exchange data with each other through the bus interface 1130.

The embedded memory unit 1140 may include a nonvolatile memory device as well as a volatile memory device. The volatile memory may include DRAM (Dynamic Random Access Memory), mobile DRAM, SRAM (Static Random Access Memory) and the like, and the nonvolatile memory device may include ROM (Read Only Memory), Nor Flash Memory, NAND Flash Memory, PRAM (Phase Change Random Access Memory), ReRAM (Resistive Random Access Memory), STTRAM (Spin Transfer Torque Random Access Memory), MRAM (Magnetic Random Access Memory) and the like. In particular, the nonvolatile memory may include the nonvolatile memory device in accordance with the embodiment of the present invention. The embedded memory unit 1140 including the nonvolatile memory device in accordance with the embodiment of the present invention includes a gate structure including a select gate over a substrate and a memory gate formed on one sidewall of the select gate and having a P-type channel. In addition, the embedded memory unit 1140 includes a drain region formed in a substrate at one side of the gate structure and overlapping a part of the memory gate, a source region formed in the substrate at the other side of the gate structure and overlapping a part of the select gate, and a contact structure electrically merging the select gate and the memory gate and having the same contact area with the memory gate as a contact area with the select gate. The embedded memory unit 1140 may reduce the size of a peripheral circuit to thereby reduce the size of the device, and may prevent the degradation of reliability including endurance. Through this structure, the size of the embedded memory unit 1140 may be minimized, and the capacity of the embedded memory unit 1140 may be maximized within the same area. In order to reduce the size of the processor 1100, a small-sized embedded memory unit 1140 is required. Furthermore, in order to increase the performance of the processor 1100, the reliability of the embedded memory unit 1140 may need to be improved. Since the embedded memory unit 1140 in accordance with the embodiment of the present invention may improve the reliability while minimizing the size, it is possible to not only reduce the size the processor 1100, but also improve the performance of the processor 1100.

The communication module unit 1150 may include a module that may be connected to a wired network and a module that may be connected to a wireless network. The wired network module may include LAN (Local Area Network), USB (Universal Serial Bus), Ethernet, PLC (Power Line Communication) and the like. The wireless network module may include IrDA (Infrared Data Association), CDMA (Code Division Multiple Access), TDMA (Time Division Multiple Access), FDMA (Frequency Division Multiple Access), Wireless LAN, Zigbee, USN (Ubiquitous Sensor Network), Bluetooth, RFID (Radio Frequency IDentification), LTE (Long Term Evolution), NFC (Near Field Communication), Wibro (Wireless Broadband Internet), HSDPA (High Speed Downlink Packet Access), WCDMA (Wideband CDMA), UWB (Ultra WideBand) and the like.

The memory control unit 1160 is configured to manage data transmitted between the processor 1100 and external storage devices operating according to different communication specifications, and may include various memory controllers to control IDE (Integrated Device Electronics), STAT (Serial Advanced Technology Attachment), SCSI (Small Computer System Interface), RAID (Redundant Array of Independent Disks), SSD (Solid State Disk), eSATA (External SATA), PCMCIA (Personal Computer Memory Card International Association), USB (Universal Serial Bus), an SD (Secure Digital) card, a mini SD (mSD) card, a micro SD card, an SDHC (Secure Digital High Capacity) card, a memory stick card, a smart media card, MMC (multimedia card), eMMC (embedded MMC), a CF (Compact Flash) card and the like.

The media processing unit 1170 is configured to process data processed by the processor 1100 or data inputted from an external input device and output the processed data to an external interface device such that the data are transmitted in the form of image, voice and the like. The media processing unit 1170 may include a GPU, a digital signal processor (DSP), a high definition (HD) audio, a high definition multimedia Interface (HDMI) controller and the like.

In accordance with the embodiments of the present invention, as the nonvolatile memory device includes the select gates, an over-erase may be prevented without an additional operation such as recovery and an additional circuit for the operation. Thus, it is possible to reduce the size of the peripheral circuit. Furthermore, since the memory gate and the drain region partially overlap each other, the program operation may be performed without using HCI. Therefore, since current consumption during the program operation may be reduced, it is possible to reduce the size of the peripheral circuit including a charge pump. Furthermore, as the nonvolatile memory device includes the connection unit to electrically merge the select gate and the memory gate, it is possible to reduce the size of the peripheral circuit including the decoder while simplifying the operation.

Furthermore, since the charge trapping and de-trapping are limited to the area where the memory gate and the drain region overlap each other, the distribution of trapped charges may be easily controlled, and characteristic degradation caused by charge trap mismatch may be prevented. Thus, it is possible to prevent the degradation of reliability including endurance.

Although various embodiments have been described for illustrative purposes, it will be apparent to those skilled in the art that various changes and modifications may be made without departing from the spirit and scope of the invention as defined in the following claims.

What is claimed is:

1. A nonvolatile memory device comprising:
   a gate structure comprising a select gate formed over a substrate and a memory gate formed on one sidewall of the select gate;
   a drain region formed in the substrate at one sidewall of the gate structure and overlapping a part of the memory gate;
   a source region formed in the substrate at the other sidewall of the gate structure and overlapping a part of the select gate; and
   a contact structure formed over the gate structure and electrically merging the select gate and the memory gate.

2. The nonvolatile memory device of claim 1, wherein a contact area between the memory gate and the contact structure is substantially equal to a contact area between the select gate and the contact structure.

3. The nonvolatile memory device of claim 1, wherein the select gate has a larger critical dimension (CD) than the memory gate, and the CD of the select gate corresponding to the contact structure is substantially equal to the CD of the memory gate corresponding to the contact structure.

4. The nonvolatile memory device of claim 3, wherein the select gate comprises a concave portion formed by recessing a part of the sidewall of the select gate in correspondence to the contact structure, and the memory gate comprises a convex portion formed by projecting a part of the sidewall of the memory gate in correspondence to the concave portion.

5. The nonvolatile memory device of claim 1, wherein the contact structure comprises a contact plug contacted with the select gate and the memory gate through an interlayer dielectric layer covering the entire surface of the substrate including the gate structure.

6. The nonvolatile memory device of claim 5, wherein the contact plug has a rectangular-pillar shape or elliptical-pillar shape having major and minor axes.

7. The nonvolatile memory device of claim 1, further comprising:
an N-type well formed in the substrate under the gate structure; and
an isolation layer formed in the substrate and defining an active region.

8. The nonvolatile memory device of claim 7, wherein the contact structure is positioned over the isolation layer.

9. The nonvolatile memory device of claim 7, wherein the drain region and the source region comprise a P-type impurity region formed in the N-type well.

10. The nonvolatile memory device of claim 1, wherein the drain region and the source region have an asymmetrical structure.

11. The nonvolatile memory device of claim 10, wherein the source region comprises a first impurity region and a second impurity region having a higher impurity doping concentration than the first impurity region, and
the drain region consists of only the second impurity.

12. A nonvolatile memory device comprising:
a gate structure comprising a select gate formed over a substrate and a memory gate formed on one sidewall of the select gate and having a P-type channel;
a drain region formed in the substrate at one sidewall of the gate structure and overlapping a part of the memory gate;
a source region formed in the substrate at the other sidewall of the gate structure and overlapping a part of the select gate; and
a contact structure formed over the gate structure and electrically merging the select gate and the memory gate, wherein a contact area between the contact structure and the memory gate is substantially equal to a contact area between the contact structure and the select gate.

13. The nonvolatile memory device of claim 12, wherein the select gate has a larger CD than the memory gate, and
the CD of the select gate corresponding to the contact structure is equal to the CD of the memory gate corresponding to the contact structure.

14. The nonvolatile memory device of claim 12, further comprising an N-type well formed in the substrate under the gate structure,
wherein the drain region and the source region comprise a P-type impurity region formed in the N-type well.

15. The nonvolatile memory device of claim 12, wherein the drain region and the source region have an asymmetrical structure.

* * * * *